(12) United States Patent
Kazama et al.

(10) Patent No.: US 11,561,353 B2
(45) Date of Patent: Jan. 24, 2023

(54) OPTICAL CIRCUIT

(71) Applicant: Nippon Telegraph and Telephone Corporation, Tokyo (JP)

(72) Inventors: Takushi Kazama, Musashino (JP); Yuta Ueda, Musashino (JP); Hiroyuki Ishii, Musashino (JP); Koji Takeda, Musashino (JP); Hitoshi Wakita, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/273,545

(22) PCT Filed: Aug. 30, 2019

(86) PCT No.: PCT/JP2019/034172
§ 371 (c)(1),
(2) Date: Mar. 4, 2021

(87) PCT Pub. No.: WO2020/050173
PCT Pub. Date: Mar. 12, 2020

(65) Prior Publication Data
US 2021/0215895 A1   Jul. 15, 2021

(30) Foreign Application Priority Data
Sep. 7, 2018   (JP) .............................. JP2018-168336

(51) Int. Cl.
*G02B 6/42* (2006.01)
*H05K 1/02* (2006.01)
*H05K 1/18* (2006.01)

(52) U.S. Cl.
CPC ......... *G02B 6/4266* (2013.01); *G02B 6/4251* (2013.01)

(58) Field of Classification Search
CPC .. G02B 6/4266; G02B 6/4251; G02B 6/4248; G02B 6/4271; G02B 6/4269;
(Continued)

(56) References Cited

U.S. PATENT DOCUMENTS

2003/0173663 A1* 9/2003 Kami .................. G02B 6/4201
257/728
2018/0196196 A1   7/2018 Byrd et al.

FOREIGN PATENT DOCUMENTS

JP   2002-216934 A   8/2002
JP   2002-353388 A   12/2002
(Continued)

*Primary Examiner* — Ryan A Lepisto
*Assistant Examiner* — Erin D Chiem
(74) *Attorney, Agent, or Firm* — Workman Nydegger

(57) ABSTRACT

An optical circuit is provided in which electric circuit parts and optical circuit parts are integrated in a stack on a printed substrate. The optical circuit is provided with a lid having a temperature regulation function that uses a temperature control element and an optical fiber block capable of optical input and output. Temperature control of optical circuit elements can be efficiently performed by mounting electric circuit parts and optical circuit parts on a printed substrate in advance by a reflow step using OBO technology and subsequently attaching a lid that includes a temperature control element.

9 Claims, 7 Drawing Sheets

(58) Field of Classification Search
CPC .... H05K 1/0274; H05K 1/181; H05K 1/0209; H05K 2201/066; H05K 2201/10121; H05K 2201/10219; H05K 2201/10734
See application file for complete search history.

(56) References Cited

FOREIGN PATENT DOCUMENTS

| | | | |
|---|---|---|---|
| JP | 2005128440 A | * | 5/2005 |
| JP | 2012-145743 A | | 8/2012 |
| JP | 2016-51773 A | | 4/2016 |

\* cited by examiner

OPTICAL CIRCUIT

BACKGROUND ART

The present invention relates to an integrated optical circuit. More specifically, the present invention relates to an efficient cooling mechanism and cooling method of an optical element in an integrated optical circuit.

Internet traffic is continuously increasing with expanding utilization of big data and the like, resulting in simultaneous demands being made for higher speeds and wider bandwidths but lower power consumption in optical communication networks. An optical transceiver is a key apparatus that is responsible for conversion between optical signals and electric signals in a communication network. In optical transceivers, for the purpose of attaining mutual compatibility among vendors, sizes, pin arrangements, functions, optical/electric connector shapes, monitoring control interfaces, and the like are designed as a common standard. For example, according to a representative CFP (Centum gigabit Form factor Pluggable) standard, a group of parts constituting an optical transceiver are integrated and mounted in certain form factors to be packaged.

FIG. 1 is a diagram illustrating a concept of packaging in optical transceivers. In FIG. 1, (a) functionally shows a configuration of an optical transceiver 100. The optical transceiver 100 is constituted by a light source 105, a modulator 103, an optical receiver 104, a control circuit 106 thereof, and the like. The receiver 104 has an input terminal 102 for receiving an input optical signal from an optical fiber, the modulator 103 has an output terminal 101 for outputting a modulated optical signal to an optical fiber, and terminals 107 and 108 for a transmission signal and a reception signal in the form of electric signals.

In FIG. 1, (b) is a diagram illustrating a concept of packaging of optical transceivers in an optical communication apparatus. An optical communication apparatus 110 represents a two-dimensional drawing as viewed from above a chassis of the apparatus, and optical transceivers 100-1 to 100-n shown in (a) in FIG. 1 are arranged so as to be gathered to one side of the chassis of the apparatus. An advantage of packaging optical transceivers is that high level of maintainability of the optical communication apparatus 110 is attained. Optical transceivers packaged according to the CFP standard are configured so as to be hot plug-enabled. By packaging a group of optical parts as a front end of an optical communication apparatus and collectively one-dimensionally arranging the packages 100-1 to 100-n on one side (for example, a left side of (a) in FIG. 1) of the apparatus, optical transceivers can be replaced. For example, in response to a failure of an optical transceiver or performance of an optical transceiver becoming obsolete, the optical transceiver in question can be extracted from the chassis of the optical communication apparatus 110 and replaced with a new optical transceiver.

In contrast to packaged optical transceivers such as those described above, an optical transceiver using on-board optics (OBO) technology is gathering attention. OBO refers to a mounting mode in which, instead of packaging an optical transceiver as shown in FIG. 1, a group of parts of an optical transceiver is directly bonded to a printed substrate or a board inside a communication apparatus.

FIG. 2 is a conceptual diagram of an optical communication apparatus mounted with OBO technology. An optical communication apparatus 210 represents a two-dimensional drawing as viewed from above a chassis of the apparatus, and a printed substrate 201 is provided inside the apparatus. Five sets of optical transceivers 200-1 to 200-5 are constructed on the printed substrate 201. Each optical transceiver includes an optical modulator 213, an optical receiver 214, a light source 215, a control circuit 216, and the like in a same manner to (a) in FIG. 1. An advantage of using OBO technology is that necessary parts are no longer required with packaging of optical parts and reductions in the number of parts and in mounting cost are likely to reduce cost of the communication device.

In addition, when a mode of a packaged optical transceiver is not adopted, optical parts are no longer attached and detached. Therefore, there is no longer a constraint in terms of arrangement of having to one-dimensionally mount optical transceivers in a single row along an end of a board in an optical communication apparatus as shown in (b) in FIG. 1. Conversely, since a degree of freedom in arranging optical parts (electrical parts) in the optical communication apparatus increases, the optical parts can be two-dimensionally arranged at arbitrary locations on the board. As a result, improved mounting density of parts contributes toward downsizing of the optical communication apparatus. In addition, heat management of the optical communication apparatus through ingenious arrangements of the optical parts also contributes toward reducing power consumption of the optical communication apparatus.

To begin with, a motivation for introducing OBO technology is to realize lower cost. To this end, the following two points are important. Firstly, since optical parts are to be bonded onto a board, each optical part must have a flat interface such as a ball grid array (BGA). Secondly, the parts must be able to withstand heat of a reflow step (must be reflowable). A self-alignment effect of the reflow step being accurately exerted is also important from the perspective of reducing accuracy when mounting parts. Furthermore, in addition to an electrical coupling between the optical parts and the board due to BGA, an optical coupling between the optical parts and the board must also be realized in an inexpensive manner.

CITATION LIST

Patent Literature

[PTL1] Japanese Patent Application Laid-open No. 2016-51773

SUMMARY OF THE INVENTION

Technical Problem

FIG. 3 is a sectional view showing a configuration of an optical transceiver using OBO technology in which electric circuits and optical circuits are arranged in a stack. In an optical transceiver 300, a resin sealing (mold) material 310 in which different electric circuit portions 312-1 and 312-2 are constructed and an Si optical circuit chip 330 are connected to each other by an adhesive 303 on a substrate 301. Each electric circuit portion in the resin sealing material 310 is connected via through wiring to the substrate 301 by, for example, a solder ball 302. A laser diode 320 is bonded on top of the resin sealing material 310. The electric circuit portions and the laser diode are also connected by through wiring. The Si optical circuit chip 330 has an optical control circuit 333 that includes an optical modulator and the like and receives laser light 321 from the laser diode 320. An optical fiber 331 that optically connects to the outside is held by having the mold material 310 and the Si optical circuit chip 330 sandwich an optical fiber fixing structure 332 and performs optical coupling with the Si optical circuit chip 330.

By integrating electric circuits and optical circuits in a stack as in the configuration of the optical transceiver shown in FIG. 3, a distance of electric wiring can be reduced and excessive loss of high-frequency electric signals can be avoided. While a detailed fabrication process of an optical transceiver by OBO technology will not be described here, at least a part of optical circuit elements are mounted by reflow and, depending on a combination of optical circuit elements or a construction and/or a type of the electric circuit portions, mounting can be realized by collective reflow. A configuration in which electric circuits and optical circuits are integrated in a stack as shown in FIG. 3 is not limited to just optical transceivers and various functions that combine optical parts and electrical parts can be realized.

Fabricating an optical circuit using OBO technology as shown in FIG. 3 has the following problem. A configuration of an optical transceiver in which electric circuits and optical circuits are integrated in a stack is not intended to be used while controlling a temperature of each element of mounted optical parts. Therefore, the temperature of the element is significantly affected by ambient temperature and heat generated by the element itself. Since electrical parts on a lower surface of the optical parts also generate heat, conceivably, a heat sink structure or the like is normally attached to a side of a printed substrate. However, since the optical parts are positioned at a distance from the side of a printed substrate, it is difficult to discharge heat generated on the side of the optical parts to the outside in an efficient manner. In particular, since lasers and the like have an optical output level and an operating frequency that vary according to temperature, in some applications, temperature regulation at high accuracy is required. Therefore, with the configuration of an optical transceiver shown in FIG. 3 in which electric circuits and optical circuits are integrated in a stack, although optical parts can be collectively mounted with electrical parts, temperature characteristics of the optical parts themselves end up limiting performance.

While PTL 1 discloses an electric element package in which parts with an optical control function are provided with a temperature regulation mechanism, since an optical circuit chip and an electric circuit chip having a temperature regulation mechanism must be first made into chips and then assembled, cost increases. Since the configuration disclosed in PTL 1 is premised on being mounted inside an individual package, the configuration cannot be applied to a stacked optical circuit structure that is arranged on a substrate by OBO technology as shown in FIG. 3.

The present invention has been made in consideration of the problems described above and an object thereof is to provide an efficient temperature regulation function with respect to an optical circuit having been fabricated using OBO technology.

Means for Solving the Problem

The present invention has been made to attain such an object, and an invention according to claim 1 is an optical circuit in which an electric circuit portion and an optical circuit portion are arranged in a stack on a substrate, the optical circuit including a lid inside which one or more temperature control elements are fixed, the temperature control elements being in contact with the optical circuit portion, and which is arranged so as to seal the entire optical circuit.

An invention according to claim 2 is the optical circuit according to claim 1, wherein the lid has, in parallel with a substrate surface of the substrate, at least one set of optical fiber arrays that input and output light to and from an optical waveguide of the optical circuit portion.

An invention according to claim 3 is the optical circuit according to claim 1 or 2, wherein the temperature control element inside the lid is in contact with the optical circuit portion via a metal plate.

An invention according to claim 4 is the optical circuit according to any one of claims 1 to 3, wherein the lid respectively includes temperature control elements corresponding to different optical circuit elements of the optical circuit portion, a plurality of the temperature control elements being fixed to the inside of the lid.

An invention according to claim 5 is the optical circuit according to claim 4, wherein when viewing the substrate surface of the substrate, a side wall of an outer peripheral portion of the lid is fixed on the substrate surface or fixed on the optical circuit portion.

An invention according to claim 6 is the optical circuit according to any one of claims 1 to 5, wherein a fin structure is provided on an upper surface of the lid.

Effects of the Invention

As described above, an efficient temperature regulation function with respect to an integrated optical circuit fabricated using OBO technology can be provided.

DESCRIPTION OF EMBODIMENTS

The present invention provides, in an integrated optical circuit in which electric circuit parts and optical circuit parts are arranged in a stack on a printed substrate, a configuration for efficiently performing temperature control for stabilizing operation of optical parts and a mounting mode of the optical parts.

The present invention is an optical circuit in which electric circuit parts and optical circuit parts are integrated in a stack on a printed substrate, the optical circuit including a lid having a temperature regulation function that uses a temperature control (thermoelectric control) element and an optical fiber block capable of optical input and output. Temperature control of optical circuit elements can be efficiently performed by mounting the electric circuit parts and the optical circuit parts on the printed substrate in advance by a reflow step using OBO technology and subsequently attaching the lid that includes the temperature control element. The lid refers to a sealing structure which is a lid that covers an entirety of the optical circuit integrated in a stack, which has a roughly hexahedral shape, cylindrical shape, or other arbitrary three-dimensional shape, and which has one open face.

A temperature regulation (thermoelectric cooling) element (a Peltier element) is used for regulating temperature of a relatively narrow region on an element level of an optical device or the like. As described earlier, optical parts to be collectively mounted with electrical parts must be able to withstand heat of a reflow step of around 200 degrees (must be reflowable). However, as things stand, low heat resistance of Peltier elements makes it difficult to collectively mount Peltier elements with an optical circuit which uses OBO technology and in which electric circuit parts and optical circuit parts are integrated in a stack. The optical circuit according to the present invention combines a sealing lid for preventing successive property degradation of optical parts and a Peltier element. By sealing optical parts after mounting by reflow with a lid including a Peltier element, the present invention not only suppresses successive property variation of elements but also realizes an optical circuit of which temperature is controllable and properties are stable.

Figure 3:
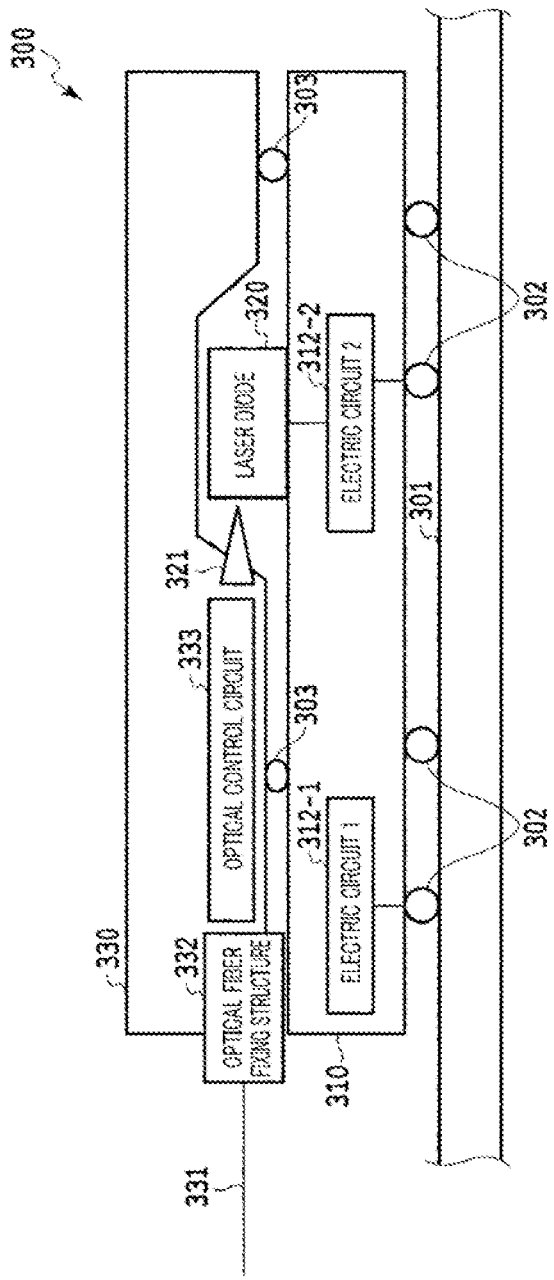
FIG. 3 is a sectional view showing a configuration of an optical transceiver using OBO technology.
Figure 4:
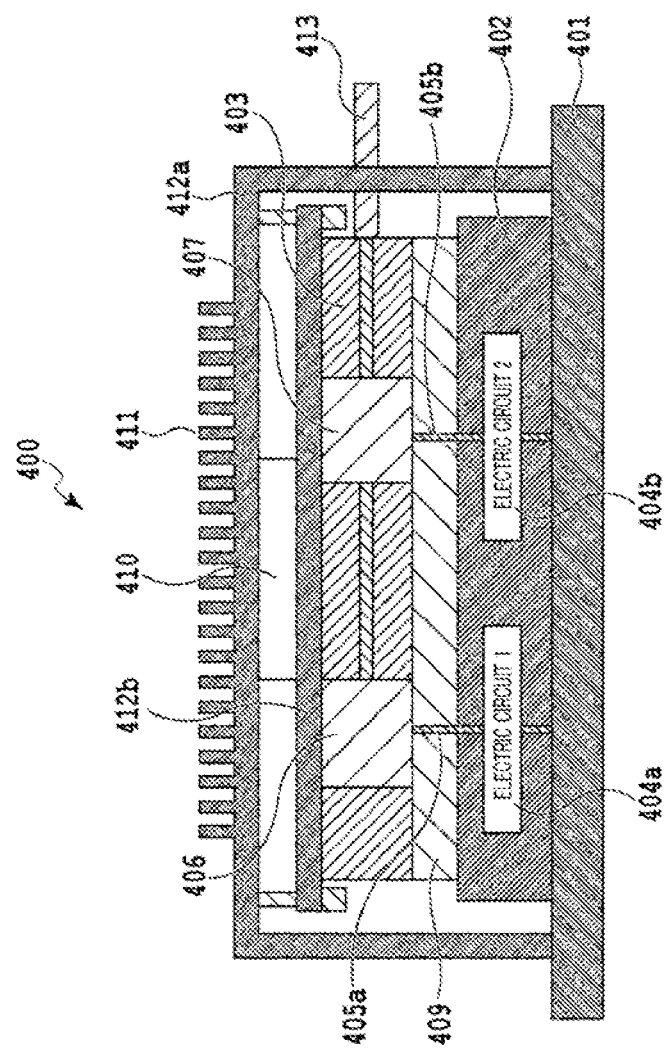
FIG. 4 is a diagram that shows an optical circuit which includes a temperature regulation mechanism and which is integrated in a stack.

FIG. 4 is a diagram that shows a configuration of an optical circuit according to the present invention which includes a temperature regulation mechanism and in which electric circuit parts and optical circuit parts are integrated in a stack. An integrated optical circuit 400 shown in FIG. 4 represents a configuration example of an optical transceiver. The optical circuit may have any kind of functionality as long as electric circuit parts and optical circuit parts are integrated in a stack. The optical circuit 400 includes a resin-sealed electric circuit portion 402 that includes electric circuits 404a and 404b constructed on a substrate 401 and an Si optical circuit portion 403 that includes a laser 406 and an optical modulator 407. FIG. 4 shows an example in which the electric circuit portion 402 exemplarily includes two electric circuits 404a and 404b. However, the number of electric circuits is not limited to two. The electric circuits 404a and 404b are sealed by a resin sealing material to constitute the electric circuit portion 402. The electric circuit portion 402 and the Si optical circuit portion 403 are bonded to each other by an adhesive 409. The electric circuits 404a and 404b which require input/output of electric signals and supply of a power source are connected to the substrate 401 and the Si optical circuit portion 403 by through wirings 405a and 405b which run through the resin material and the adhesive 409. Electric signals and the like are applied via the through wirings 405a and 405b from a bottom surface of a chip of the Si optical circuit portion 403. The optical circuit portion 403 may be constituted by a substrate having InP or the like as a material besides an Si material. As described above, in the optical circuit, the electric circuit portion 402 that includes the electric circuits 404a and 404b and the Si optical circuit portion 403 are arranged and integrated in a stack. The optical circuit may be fabricated using OBO technology in a similar manner to the configuration according to conventional art shown in FIG. 3.

The optical circuit 400 according to the present invention further includes a lid 412a and a metal plate 412b which are in contact with the optical circuit portion 403. The lid 412a and the metal plate 412b cover an uppermost portion of the optical circuit in which the electric circuit portion 402 and the Si optical circuit portion 403 are arranged and integrated in a stack. The metal plate 412b functions as a heat conductor that moves heat generated by the optical circuit portion 403. The metal plate 412b is in contact with an upper surface of the substrate of the optical circuit portion 403 and is integrally fixed with the lid 412a for sealing while sandwiching a temperature control element 410 therebetween. The lid 412a is fixed onto the printed substrate 401 so as to internally house the optical circuit described above having been constructed in a stack using OBO technology, and realizes a highly airtight sealing structure. As the lid 412a, materials with good thermal conductivity are desirable and, for example, copper-tungsten may be used. Temperature control can be performed by the temperature control element 410 that is located between the metal plate and the lid. For example, a Peltier element is most suitable as the temperature control element. The temperature control element 410 and the lid 412a, and the temperature control element 410 and the metal plate 412b, are preferably connected to each other via grease or an adhesive in order to enhance thermal conductivity.

Therefore, the present invention can be implemented as an optical circuit in which electric circuit portions and optical circuit portions are arranged in a stack on a substrate, the optical circuit including a lid inside which one or more temperature control elements are fixed, the temperature control elements being in contact with the optical circuit portions, and which is arranged so as to seal the entire optical circuit.

In the configuration of the optical circuit 400 shown in FIG. 4, a size of the optical circuit portion 403 is larger than that of the temperature control element 410 (Peltier). Therefore, the metal plate 412b with a larger area than the optical circuit portion is bonded to a lower surface of the temperature control element 410 and the entire lid is formed so as to sandwich the temperature control element 410. The use of the metal plate 412b realizes a construction with high heat exhausting property. When the size of the temperature control element 410 is similar to that of the optical circuit portion 403, a structure that causes the temperature control element 410 to come into direct contact with the optical circuit portion 403 without the metal plate may suffice. A fin structure 411 for discharging heat generated from the Peltier element is preferably formed on an upper surface of the lid 412b to further enhance the heat exhausting property. An optical output from the optical circuit portion 403 is coupled to an optical fiber through a fiber block 413 that is fixed to a side wall of the lid 412b. In addition, although not shown in FIG. 4, an interface with the temperature control element can be performed via the lid 412b.

A detailed fabrication method of the optical circuit 400 with a temperature regulation function shown in FIG. 4 will not be described. However, in general terms, the optical circuit 400 is fabricated by the following steps.

Step 1: Fabricate an optical circuit portion and an electric circuit portion and bond the portions together.

Step 2: Segment the bonded element into chips.

Step 3: Mount the chip onto a printed substrate and perform a reflow step.

Step 4: Attach a lid with a Peltier to the chip on the printed substrate, seal the lid, and connect an optical coupling portion.

The steps described above include a step of constructing through wiring between the optical circuit portion and the electric circuit portion and a sub-step of sealing an electric circuit with resin. Different sequences and combinations of the various fabrication steps are possible. A fabricator can execute a part of or all of the steps up to the bonding of the optical circuit portion and the electric circuit portion on a wafer level. Therefore, optical circuits to which the present invention can be applied need only include so-called OBO technology in which an optical circuit (an optical chip) is mounted onto a substrate (board).

Figure 5:
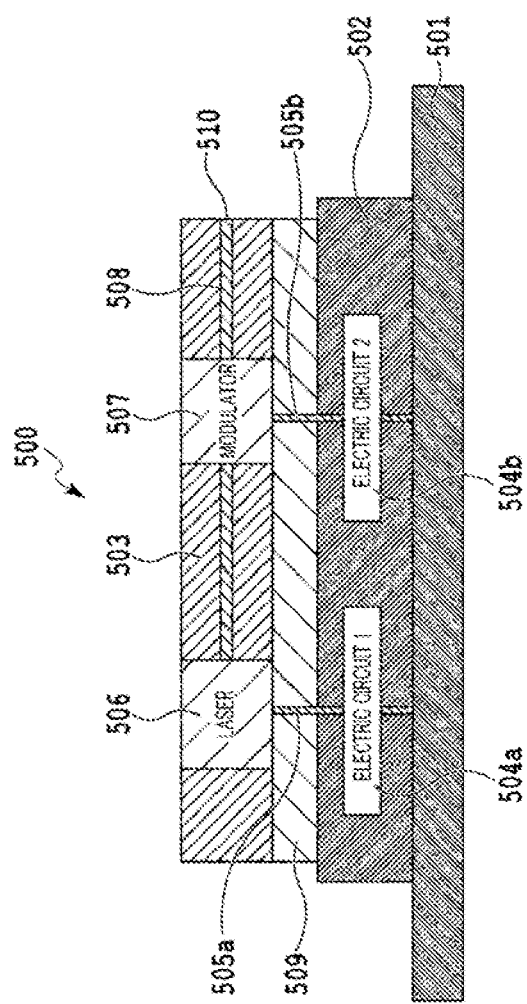
FIG. 5 shows a configuration of an optical circuit integrated in a stack prior to mounting a lid.

FIG. 5 shows a configuration of an integrated optical circuit 500 at a time point of completing the steps 1 to 3 described above and prior to mounting the lid. On a printed substrate 501, a resin-sealed electric circuit portion 502 that includes electric circuits 504a and 504b and an optical circuit portion 503 that includes a laser 506 and an optical modulator 507 are integrated in a stack while sandwiching an adhesive layer 509 therebetween. A core of an optical waveguide 508 appears on an end surface 510 of an Si substrate that constitutes the optical circuit portion 503 in an optical coupling-enabled state. In the optical circuit 500 shown in FIG. 5, an output direction of light from the optical waveguide 508 is parallel to the printed substrate 501. Electric connection between the electric circuit portion and the optical circuit portion is performed via through wirings 505a and 505b which are formed so as to penetrate the resin material and the adhesive 509. The optical circuit 500 is fabricated by the steps 1 to 3 using OBO technology described above.

Figure 6:
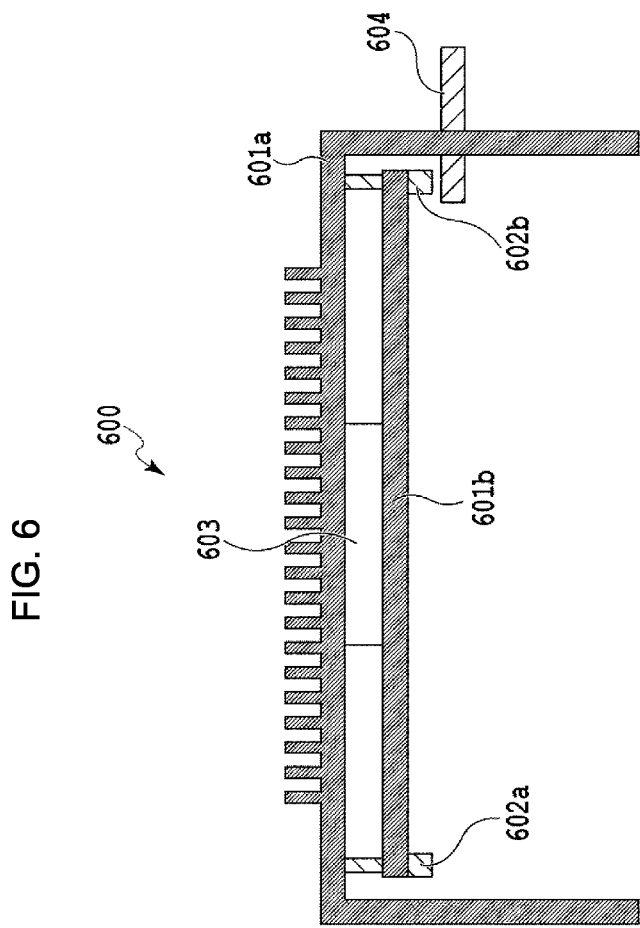
FIG. 6 is a diagram that shows a configuration of a lid to be mounted to an optical circuit integrated in a stack.

FIG. 6 is a diagram that shows a configuration of a lid portion prior to being mounted to an optical circuit having been arranged and integrated in a stack. As also shown in FIG. 4, a lid portion 600 is constituted by a lid 601a, a metal plate 601b, and the like. The lid 601a and the metal plate 601b are fixed by holding mechanisms 602a and 602b so as to sandwich a temperature control element 603 so that entireties of the lid 601a and the metal plate 601b come into close contact with each other. The lid 601a and the metal plate 601b may be made of different materials or a same material. The lid 601a is structured so as to be capable of covering an upper surface and a side surface of the stacked optical circuit 500 shown in FIG. 5 and sealing the entire optical circuit 500 together with the printed substrate 501.

An implementing party of the present invention performs the reflow step in step 3 described above and, after mounting the optical circuit arranged and integrated in a stack onto the printed substrate, further mounts the lid portion 600 shown in FIG. 6. In the lid 601a, an optical fiber array block 604 is arranged so as to match a position of an output core 510 of the optical circuit portion 503. The optical fiber array block refers to a plurality of optical fibers being fixed by a glass material or the like, and the lid 601a is constructed so as to hold the optical fiber array block 604 as a mechanism. In addition, the fin structure of the lid portion 600 and the temperature control element 603 (a Peltier element) are arranged so as to match a position of the optical circuit portion 503 of the optical circuit to be housed. By arranging the lid portion 600 at a pre-designed position on the printed substrate, the implementing party of the present invention can perform temperature control of optical parts and optical coupling to external optical fibers. As described above, by mounting an optical integrated circuit and an electric circuit onto a printed substrate by a reflow step and subsequently attaching a lid that includes a temperature control element, the implementing party of the present invention can realize optical parts of which temperatures can be controlled. The optical fiber array block may sometimes be simply referred to as an optical fiber array.

Figure 1A:
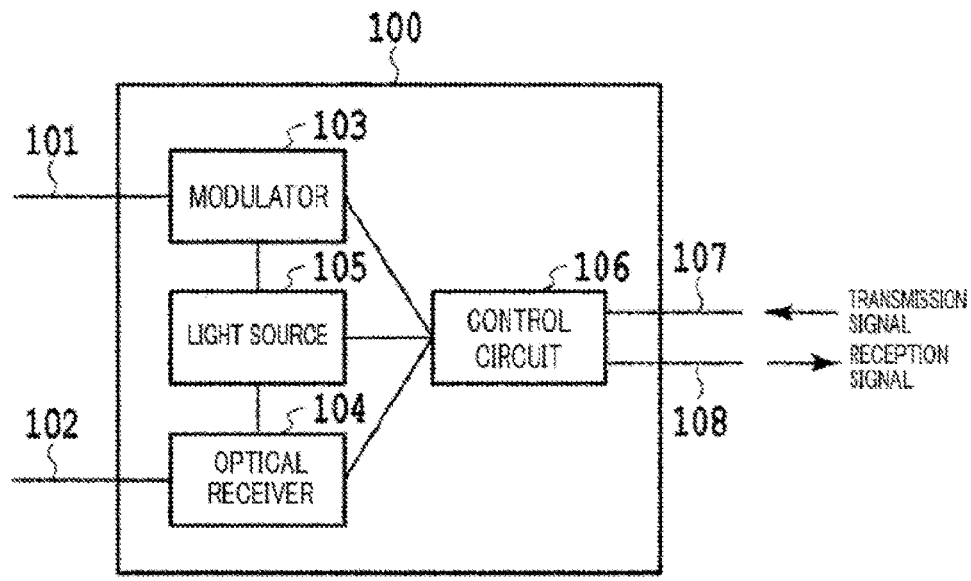
FIG. 1 is a diagram that conceptually illustrates packaging in an optical transceiver.
Figure 1B:
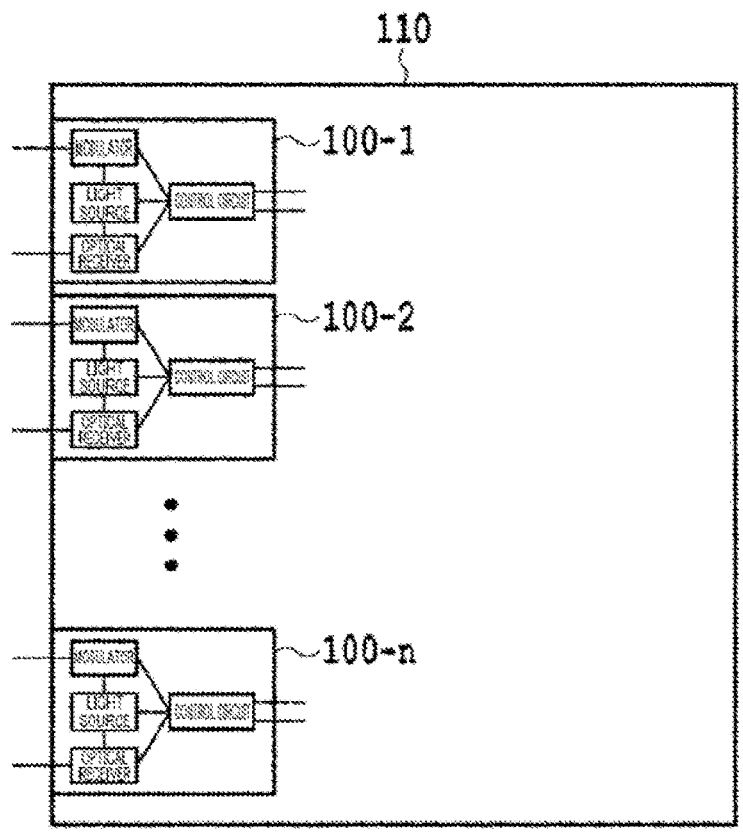
Figure 2:
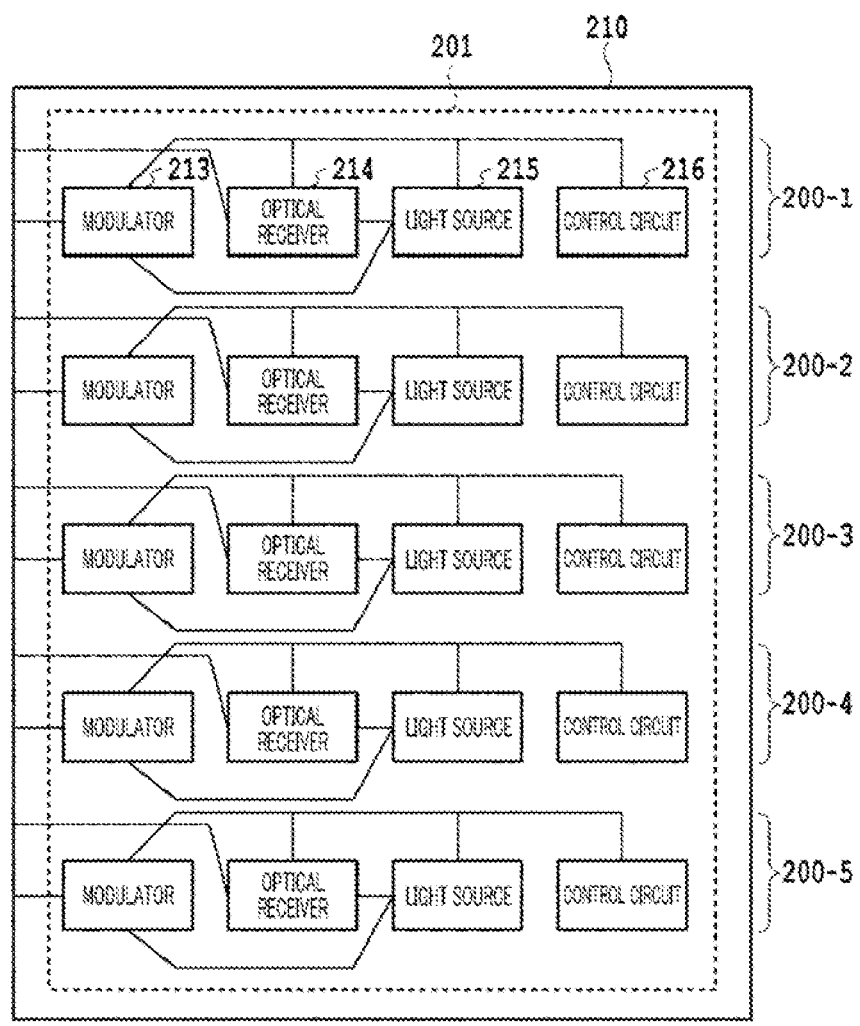
FIG. 2 is a conceptual diagram of an optical communication apparatus mounted with OBO technology.

The optical circuit 400 including a temperature regulation mechanism according to the present invention shown in FIG. 4 is a configuration in which a lid with a single temperature control element is combined with a single optical circuit portion chip including a plurality of optical circuits. However, optical circuits according to the present invention can adopt other combinations of a temperature control element and a lid. For example, when a plurality of optical transceivers are configured in an array as shown in FIG. 2 on a single optical circuit portion chip and arranged in a stack together with corresponding electric circuit portions, the lid can include a plurality of Peltier elements.

Figure 7:
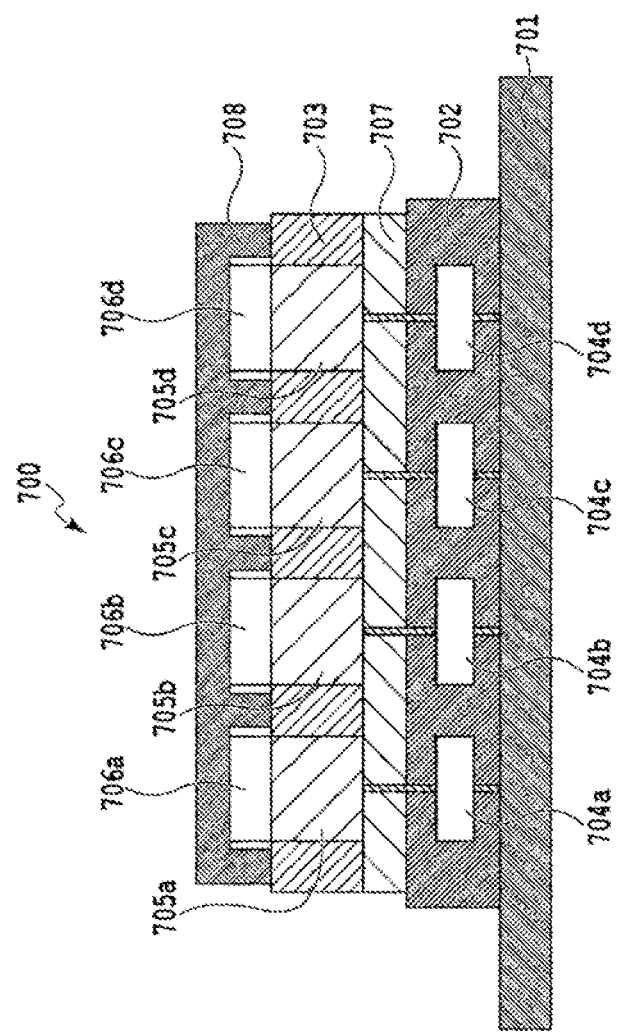
FIG. 7 is a diagram that shows a configuration of an optical circuit mounted with a lid including a plurality of temperature control elements.

FIG. 7 is a diagram that shows a configuration of an optical circuit mounted with a lid including a plurality of temperature control elements. FIG. 7 represents a cross section taken along an array direction (a longitudinal direction in FIG. 2) of an array of four optical transceiver circuits as shown in FIG. 2. In the integrated optical circuit 700, the numbers of the optical circuit elements 705a to 705d that are included in the optical circuit portion 703 and the corresponding electric circuits 704a to 704d that are included in the electric circuit portion 702 differ from those in the case of the optical circuit 400 shown in FIG. 4. Assuming that, for example, the optical circuit portion 703 includes four optical transceivers 705a to 705d, corresponding temperature control elements 706a to 706d are provided so as to come into contact with each optical transceiver. The four temperature control elements 706a to 706d are fixed by a single lid 708 having four housing spaces so as to come into close contact with upper surfaces of the respective optical transceivers of the optical circuit portion 703. As shown in FIG. 7, the implementing party of the present invention may construct a temperature regulation mechanism by combining a plurality of temperature control elements with a single shared lid.

In other words, the lid in the optical circuit according to the present invention respectively includes a temperature control element that corresponds to different optical circuit elements of the optical circuit portion. The implementing party can fix a plurality of the temperature control elements to the inside of the lid.

The lid 708 shown in FIG. 7 is constructed to provide partitions using walls perpendicular to the substrate surface of the optical circuit portion 703 so as to form an individual housing space that independently encloses a temperature control element corresponding to each optical transceiver. However, the implementing party of the present invention may only make walls higher in an outermost peripheral portion of the lid when viewing the substrate surface of the optical circuit portion 703 and fix the entire lid on the printed substrate 701 using the walls in the outer peripheral portion. Therefore, the optical circuit according to the present invention can adopt, when viewing the substrate surface of the substrate of the optical circuit, both of a configuration in which a side wall of the outer peripheral portion of the lid is fixed on the substrate surface and a configuration in which the side wall of the outer peripheral portion of the lid is fixed on the optical circuit portion. Since FIG. 7 represents a cross section taken along an array direction (a direction approximately perpendicular to an optical waveguide) of an array of optical transceivers, an optical fiber block is not shown. However, as shown in FIG. 4, an optical fiber block may be arranged so that an emitting direction is oriented perpendicular to the drawing in FIG. 7 and the optical fiber block may be held by the lid 708.

As described above, the present invention provides, with respect to an optical circuit using OBO technology in which an electric circuit portion and an optical circuit portion are arranged in a stack, an efficient temperature regulation mechanism by a temperature control element mounted to a lid that can also be used for sealing. Since the temperature control element is directly brought into contact with an optical circuit element that generates heat with respect to the optical circuit in which the electric circuit portion and the optical circuit portion are integrated in a stack, efficient temperature regulation can be performed with respect to the optical circuit element that requires temperature regulation.

INDUSTRIAL APPLICABILITY

The present invention can be generally used in optical communication systems. In particular, the present invention can be used in optical transceivers.

REFERENCE SIGNS LIST

100, 100-1 to 100-n, 200-1 to 200-5 Optical transceiver
103, 213, 407, 507 Optical modulator
110, 210 Optical communication apparatus
201, 301, 401, 501, 701 Substrate (board)
312-1, 312-2, 404a, 404b, 504a, 504b, 704a to 704d Electric circuit
330, 403, 503, 703 Optical circuit portion
400, 500, 700 Integrated optical circuit
402, 502, 702 Electric circuit portion
405a, 405b, 505a, 505b Through wiring
406, 506 Laser
410, 603, 706a to 706d Temperature control element (Peltier)
411 Fin
412a, 601a, 708 Lid
412b, 601b Metal plate
600 Lid portion
604 Optical fiber array block
705a to 705d Optical circuit element

The invention claimed is:

1. An optical circuit comprising:
   a substrate;
   an electric circuit portion;
   an optical circuit portion, wherein the electric portion and the optical circuit portion are arranged in a stack on the substrate;
   a lid which is arranged so as to seal the entire optical circuit;
   one or more temperature control elements; and
   a metal plate which is arranged in parallel with the substrate,
   wherein the one or more temperature control elements are fixed between the lid and the metal plate such that a first surface of the one or more temperature control elements contacts the lid, and a second surface of the one or more temperature control elects contacts the metal plate, and
   wherein a first surface of the optical circuit portion is in contact with the one or more temperature control elements via a metal plate.

2. The optical circuit according to claim 1, wherein the lid has, in parallel with a substrate surface of the substrate, at least one set of optical fiber arrays that input and output light to and from an optical waveguide of the optical circuit portion.

3. The optical circuit according to claim 2, wherein the lid respectively includes temperature control elements corresponding to different optical circuit elements of the optical circuit portion, a plurality of the temperature control elements being fixed to the inside of the lid.

4. The optical circuit according to claim 2, wherein a fin structure is provided on an upper surface of the lid.

5. The optical circuit according to claim 1, wherein the lid respectively includes temperature control elements corresponding to different optical circuit elements of the optical circuit portion, a plurality of the temperature control elements being fixed to the inside of the lid.

6. The optical circuit according to claim 5, wherein when viewing the substrate surface of the substrate, a side wall of an outer peripheral portion of the lid is fixed on the substrate surface or fixed on the optical circuit portion.

7. The optical circuit according to claim 6, wherein a fin structure is provided on an upper surface of the lid.

8. The optical circuit according to claim 5, wherein a fin structure is provided on an upper surface of the lid.

9. The optical circuit according to claim 1, wherein a fin structure is provided on an upper surface of the lid.

* * * * *